(12) United States Patent
Geppert et al.

(10) Patent No.: US 7,622,923 B2
(45) Date of Patent: Nov. 24, 2009

(54) METHOD AND APPARATUS FOR ACQUISITION OF MAGNETIC RESONANCE DATA

(75) Inventors: Christian Geppert, Erlangen (DE); Bernd Kuehn, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/188,344

(22) Filed: Aug. 8, 2008

(65) Prior Publication Data

US 2009/0039885 A1  Feb. 12, 2009

(30) Foreign Application Priority Data

Aug. 9, 2007 (DE) .................. 10 2007 037 657

(51) Int. Cl.
*G01V 3/00* (2006.01)
(52) U.S. Cl. ........................ 324/309; 324/307
(58) Field of Classification Search ......... 324/300–322; 600/407–445
See application file for complete search history.

(56) References Cited

U.S. PATENT DOCUMENTS

| | | | |
|---|---|---|---|
| 5,570,019 A | 10/1996 | Moonen et al. | |
| 6,380,740 B1 | 4/2002 | Laub | |
| 6,577,127 B2* | 6/2003 | Harvey et al. | 324/307 |
| 6,611,144 B2* | 8/2003 | Abe | 324/309 |
| 6,639,211 B1 | 10/2003 | Anand et al. | |
| 6,694,165 B2* | 2/2004 | Zhu | 600/410 |
| 6,912,302 B2 | 6/2005 | Sato et al. | |
| 6,914,429 B2 | 7/2005 | Ookawa | |
| 7,385,397 B2* | 6/2008 | Uchizono et al. | 324/318 |
| 7,489,962 B2* | 2/2009 | Cull et al. | 600/410 |
| 2007/0069724 A1 | 3/2007 | Zhao et al. | |
| 2007/0078331 A1 | 4/2007 | Cull et al. | |
| 2008/0068014 A1* | 3/2008 | Dannels | 324/312 |
| 2009/0105582 A1* | 4/2009 | Dougherty et al. | 600/420 |

FOREIGN PATENT DOCUMENTS

WO  WO 2006/120584  11/2006

* cited by examiner

*Primary Examiner*—Brij B Shrivastav
(74) *Attorney, Agent, or Firm*—Schiff Hardin LLP

(57) ABSTRACT

In a magnetic resonance method and apparatus for acquisition of measurement data from a subject, k-space to be scanned into an inner region and an outer region, and the inner region is divided into inner segments that differ in terms of their distance from a k-space center and the outer region is divided into outer segments that differ in terms of their distance from a k-space center. First k-space data are acquired for the inner region, wherein k-space lines of the inner region are divided into first groups such that k-space lines from different inner segments are associated in each of the first groups, and the first groups are successively scanned. Second k-space data are acquired for the outer region, wherein k-space lines of the outer region are divided into second groups such that k-space lines from different outer segments are associated in each of the second groups, and the second groups are successively scanned.

17 Claims, 5 Drawing Sheets

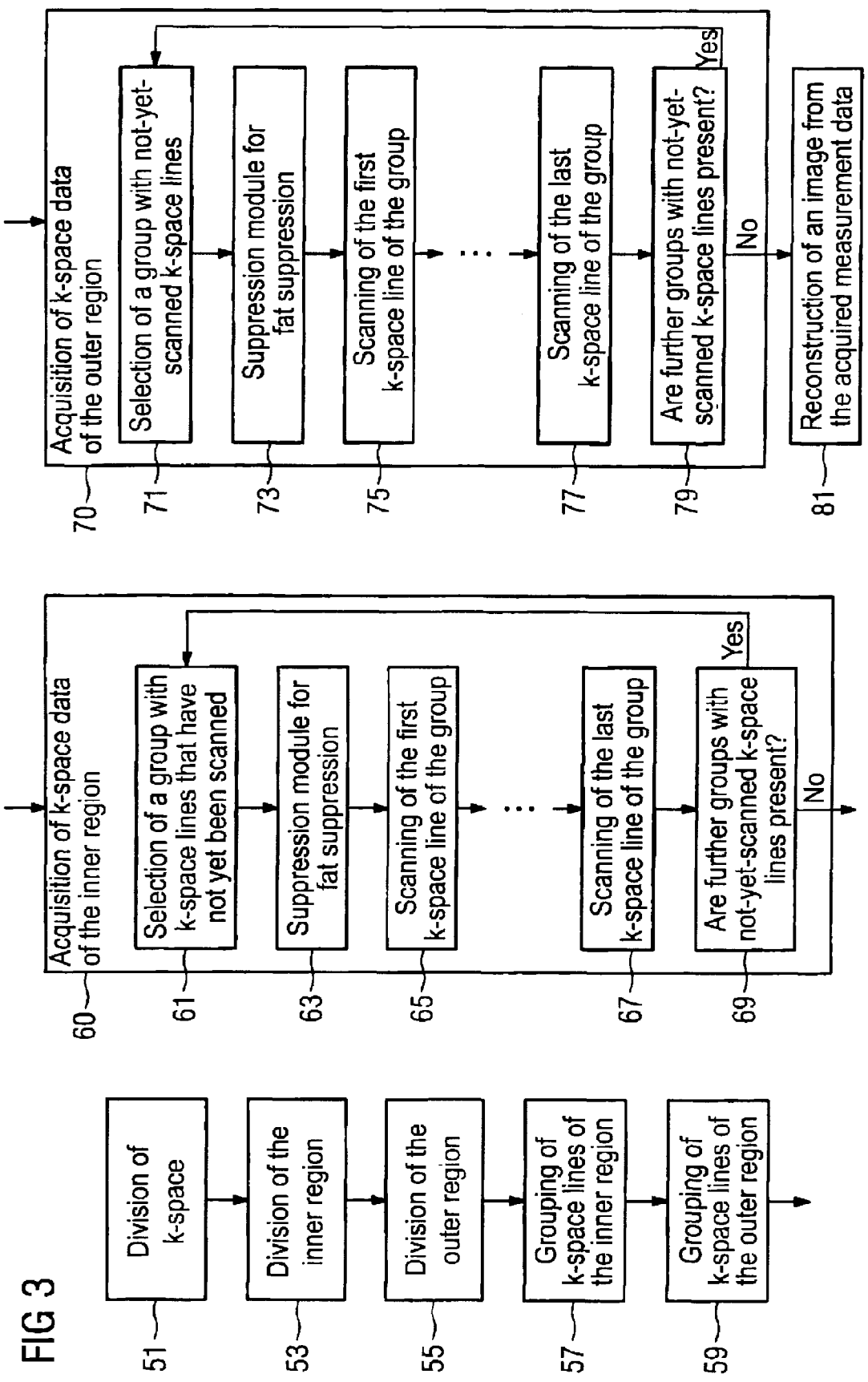

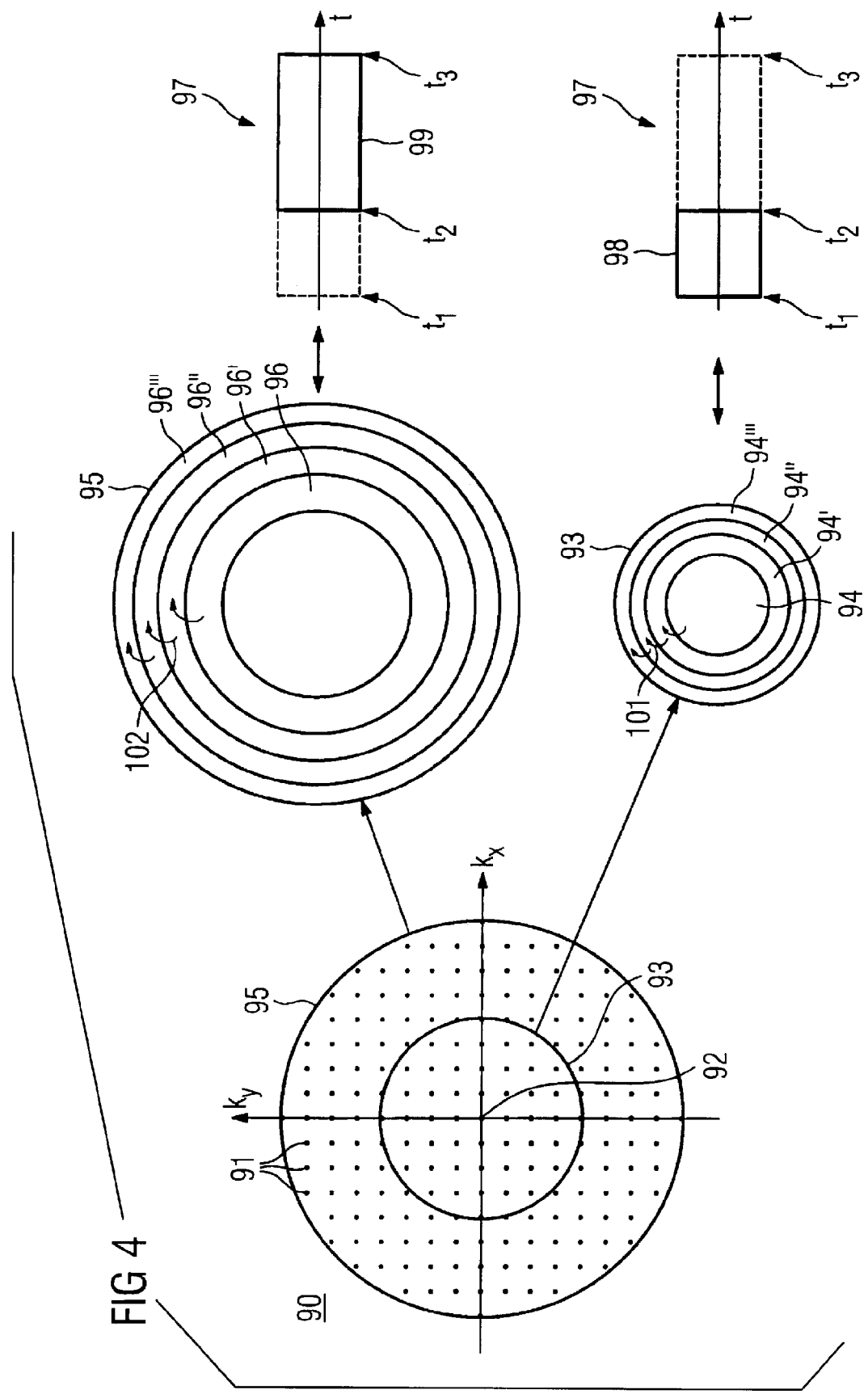

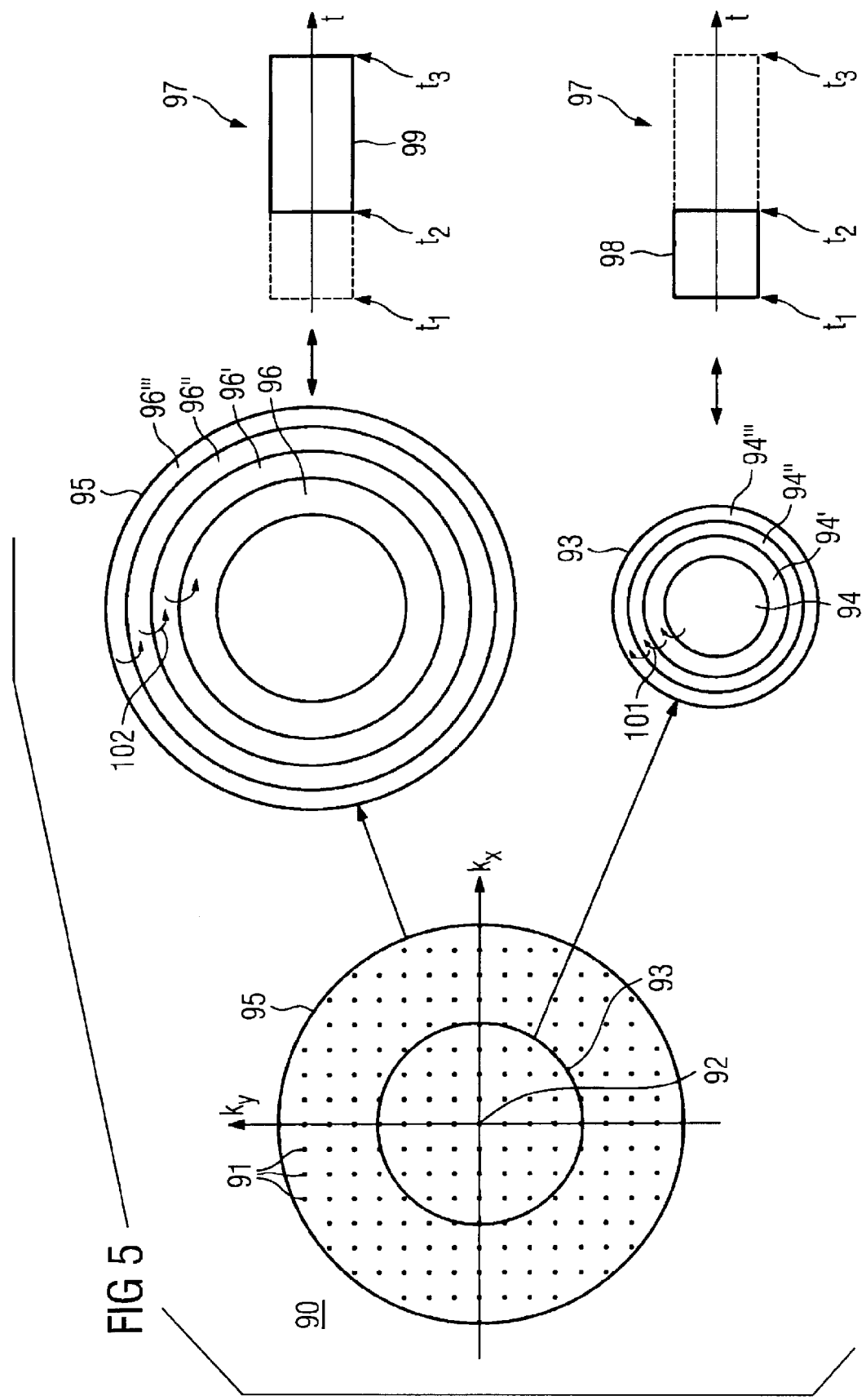

ated by fatty tissue protons. A suppression of this signal can be achieved, for example, by radiating an inversion pulse is radiated, or by radiating a saturation pulse that is frequency-selective for fatty tissue protons at a temporally defined interval before the scanning of k-space (i.e. before the acquisition of the actual measurement data). However, this technique can significantly lengthen the measurement duration of an MR examination. Therefore multiple readout modules are often executed after a pulse for fat suppression, such that multiple k-space lines are scanned after this pulse.

METHOD AND APPARATUS FOR ACQUISITION OF MAGNETIC RESONANCE DATA

BACKGROUND OF THE INVENTION

1. Field of the Invention

The present invention concerns a method for acquisition of measurement data by magnetic resonance (in the following, the abbreviation MR stands for magnetic resonance) as used in particular in the acquisition of measurement data in which a fat signal is suppressed and/or in which a contrast agent is injected. Furthermore, the invention concerns a magnetic resonance apparatus for implementation of such a method.

2. Description of the Prior Art

MR technology is a technology known for some decades with which images of the inside of an examination subject can be generated. Described with significant simplification, for this purpose the examination subject is positioned in a strong, static, homogeneous basic magnetic field (field strengths of 0.2 Tesla to 7 Tesla and more) in an MR apparatus so that the nuclear spins in the subject orient along the basic magnetic field. To trigger magnetic resonances, radio-frequency excitation pulses are radiated into the examination subject, and the triggered nuclear magnetic resonances are measured (detected) and MR images are reconstructed based on these signals. For spatial coding of the measurement data, rapidly switched gradient fields are superimposed on the basic magnetic field. The acquired measurement data are digitized and stored in a k-space matrix as complex numerical values. An MR image can be reconstructed from the k-space matrix populated with values by means of a multi-dimensional Fourier transformation.

MR technology is characterized by a variably adjustable tissue contrast that can be achieved by adapting the radiated magnetic fields and the excitation pulses.

A fat signal is often suppressed to achieve a desired tissue contrast. That term "fat signal", means a signal that is generated by fatty tissue protons. A suppression of this signal can be achieved, for example, by radiating an inversion pulse is radiated, or by radiating a saturation pulse that is frequency-selective for fatty tissue protons at a temporally defined interval before the scanning of k-space (i.e. before the acquisition of the actual measurement data). However, this technique can significantly lengthen the measurement duration of an MR examination. Therefore multiple readout modules are often executed after a pulse for fat suppression, such that multiple k-space lines are scanned after this pulse.

In this technique, k-space to be scanned is sub-divided into multiple segments. A k-space line from a segment is scanned with each readout module after a pulse. Given three-dimensional measurements, k-space can be divided into radially arranged segments, for example, as is shown in FIG. 2. FIG. 2 shows a plane of three-dimensional k-space 40, wherein k-space lines 41 run perpendicular to this plane. The segments 42, 42', 42", 42'" are typically read out in a central scanning scheme after a pulse for fat suppression. This means that a k-space line 41 of the central segment 42 is scanned first, followed by a k-space line 41 of the next segment 42' etc. This continues until a k-space line 41 of the outermost segment 42'" has been scanned. A pulse for fat suppression is subsequently radiated again. Different k-space lines of the segments 42, 42', 42", 42'" are scanned this time in a similar manner, beginning at the central segment 42. This procedure is continued until a desired number of k-space lines 41 have been scanned.

Such a scanning scheme has the advantage that artifacts that are caused by movements of the subject to be examined (for example due to breathing movements) are smeared in the image and do not generate interfering structures in the image. Moreover, the quality of the fat suppression can be decoupled from the spatial resolution with such a scanning scheme.

Nevertheless, the need exists to improve such sequences.

SUMMARY OF THE INVENTION

An object of the invention is to provide a method for acquisition of measurement data by means of magnetic resonance with which artifacts, in particular those that are caused by movement, are suppressed in an effective manner while simultaneously achieving faster acquisition of measurement data. Furthermore, it is an object of the invention to provide a magnetic resonance apparatus for implementation of such a method.

The above object is achieved by a method according to the invention for acquisition of measurement data of a subject to be examined by magnetic resonance that measures the steps of:

division of k-space to be scanned into an inner region and an outer region, division of the inner region into inner segments that differ in terms of their distance from a k-space center, division of the outer region into outer segments that differ in terms of their distance from a k-space center, acquisition of first k-space data for the inner region, wherein k-space lines of the inner region are divided into first groups such that k-space lines from different inner segments are associated in each of the first groups, and the first groups are successively scanned, and acquisition of second k-space data for the outer region, wherein k-space lines of the outer region are divided into second groups such that k-space lines from different outer segments are associated in each of the second groups, and the second groups are successively scanned.

The invention is based on the insight that a suppression of artifacts can be achieved given a central scanning scheme as is known from the prior art described above. The invention is based on the insight that the disadvantage associated with such conventional scanning occurs because k-space lines of the central segment are acquired over the entire duration of the acquisition of measurement data. There thus exists no defined point in time at which a central region of k-space is scanned. This can cause significant disadvantages depending on where methods known from the prior art are used to acquire measurement data.

When methods known from the prior art are used, for example in a contrast agent examination, the total duration of the measurement often exceeds the duration of individual phases of a contrast agent such as, for example, the uptake (enhancement) phase, an arterial phase or a venous phase of the contrast agent. In this case, central k-space lines (i.e. k-space lines of the central segment) are acquired during multiple phases of the contrast agent, for example both during the uptake phase and during the following phases. Important parts of the k-space data that determine the contrast (i.e. central k-space data) are acquired at different phases of the contrast agent flow. This leads to a disadvantageous contrast in an image reconstructed from the measurement data since the contrast is subject to an averaging effect.

By contrast, in the method according to the invention k-space is divided into an inner region and an outer region. The inner region corresponds to a central k-space region and can be dimensioned such that it can be scanned within a predetermined time interval. The outer region can be scanned after a scan of the inner region has occurred. It is thus possible to scan the inner (i.e. central) region at a defined point in time.

The scanning of the inner region ensues with a central scanning scheme. The scanning of the outer region likewise ensues with a central scanning scheme.

In the method according to the invention, the scanning of the inner region occurs such that the inner region is divided into various inner segments that differ in their distance from the k-space center. The k-space lines of the inner region are scanned per group. K-space lines from different inner segments thus are respectively associated with a group. Upon scanning one of these groups, all k-space lines that are associated with this group are scanned. A scanning of a specific k-space line can be achieved in a known manner by suitably switched gradient fields and excitation pulses. K-space lines from different segments of the inner region are thus scanned in the scanning of one of the groups. In the scanning of the inner region, it is thus possible to execute a scanning scheme that allows an effective suppression of movement artifacts.

The same applies for the outer region that is divided into outer segments that differ in their distance from the k-space center.

Overall, by the method according to the invention it is possible to achieve an effective suppression of artifacts, in particular movement artifacts. Moreover, in the method according to the invention it is simultaneously possible to scan a central k-space region at a defined point in time. A specific contrast response thus can be achieved in an effective manner in an image reconstructed from the measurement data, even when the condition for a specific contrast response exists only in a time-limited time interval.

In an embodiment, a suppression module to suppress signals of nuclear spins of a specific type (in particular of signals of fatty tissue protons) is executed in at least some of the first groups (in particular in every group of the first groups) before their scanning. In an analogous manner, a suppression module to suppress signals of nuclear spins of a specific type (in particular of signals of fatty tissue protons) can be radiated in at least some of the second groups (in particular in every group of the second groups) before their scanning.

In this way a specific contrast response can be achieved or modified in a simple manner in a reconstructed image since signals of specific nuclear spins (in particular of fatty tissue protons) are suppressed. A suppression of these signals can be realized in a known manner using the suppression module. For example, it is possible to radiate an inversion pulse (i.e. an RF pulse—RF for radio-frequency—with a flip angle of essentially 180°) during the suppression module. The subsequent scanning of a group of k-space lines is temporally matched to the inversion pulse such that the longitudinal magnetization of the nuclear spins of the specific type is located in proximity to the zero crossing at the point in time of the scanning of the k-space lines. However, it is also possible, for example, to radiate a frequency-selective saturation pulse during the suppression module so that selective nuclear spins of the specific type are excited. During a following scanning of a group of k-space lines, these nuclear spins are already saturated and therefore contribute only in a more reduced way to an acquired signal.

In an embodiment, a k-space line from each of the inner segments is respectively associated with each of the first groups. In an analogous manner, a k-space line from each of the outer segments can respectively be associated with each of the second groups. A division of the k-space lines into the individual groups can hereby be achieved in a particularly simple manner.

In another embodiment, the number of inner segments corresponds to the number of outer segments. Each group (i.e. each first group and each second group) is respectively associated with an identical number of k-space lines. With these embodiments, it can be achieved in a simple manner that an equilibrium state (also designated as a "steady state") is achieved and maintained in a scan since the same number of k-space lines is always scanned in each scan of a group.

In the embodiment, the size of the inner segments is selected such that each of the inner segments possesses an essentially identical number of k-space lines. Given a division of the k-space lines of the inner region into the first group, it can be achieved in a simple manner that precisely one k-space line from each of the inner segments is respectively associated in each group.

The size of the outer segments is selected in an analogous manner so that each of the outer segments possesses an essentially identical number of k-space lines.

The order of the scanning of the k-space lines associated with a group advantageously conforms with their distance from the k-space center. Given the scanning in each group, it is ensured in this way that the associated k-space lines are always scanned in the same order relative to the distance to the k-space center.

In an embodiment, given the acquisition of the first k-space data for the inner region, an order of the scanning of the k-space lines associated with a group is established in each of the first groups based on the distance of said k-space lines from the k-space center, such that k-space lines with a smaller distance from the k-space center are scanned before k-space lines with a greater distance from the k-space center. This means that the associated k-space lines are sorted within a group depending on their distance from the k-space center. Central k-space lines are thereby scanned before peripheral k-space lines. This embodiment always has advantages when a contrast response of the acquired measurement data depends on a point in time of the acquisition of the measurement data within the sequence. Namely, a similar contrast response is enabled in adjacent k-space regions. K-space lines with similar distance from the k-space center are located at the same position in the order of the scanning and are thus scanned at points in time corresponding to one another.

For example, if a suppression module for suppression of signals of nuclear spins of a specific type is applied before the scanning, the degree of the suppression (or the resulting image contrast) of these signals depends on the point in time at which the individual k-space lines of the group are scanned after execution of the suppression module. In this embodiment, k-space lines with similar distance from the k-space center are scanned at the same points in time during the scanning of the groups. The scanned k-space data thus exhibit an identical degree of suppression.

In another embodiment, the same applies in the acquisition of the second k-space data of the outer region. In each of the second groups, an order of the scanning of the k-space lines associated with a group is established based on their distance from the k-space center. K-space lines with a smaller distance from the k-space center are scanned before k-space lines with a larger distance from the k-space center. A scan of the k-space lines in the outer region corresponds in this way to the scanning of the k-space lines in the inner region.

By contrast, in another embodiment the order of the scanning of the k-space lines, respectively associated with groups is established based on their distance from the k-space center in each of the second groups given the acquisition of the second k-space data for the outer region. However, in this embodiment k-space lines with a greater distance from the k-space center are scanned before k-space lines with a smaller distance from the k-space center. In this way it is achieved that k-space lines in the transition region between the inner region and the outer region possess a similar contrast response. Namely, in the inner region k-space lines of the outermost of the inner segments are acquired at the end of any one group. In the outer region, k-space lines of the subsequent segment (i.e. of the innermost of the outer segments) are likewise acquired at the end of any one group. A continuous contrast response in k-space results from this in the transition region from the inner region to the outer region.

In another embodiment, the size of the inner region is dimensioned such that the scanning can be implemented within a predetermined time interval. For example, in specific examinations a condition desired for the examination can exist only during a specific time period. Because the size of the inner region is matched to this time duration, the important k-space data of the inner region can be acquired while the advantageous condition exists. K-space data of the outer region that are less important for the contrast can be acquired beforehand and/or afterward.

For example, the predetermined time interval can be determined by the duration of individual phases of a contrast agent flow such as, for example, in the uptake time or the washout time of a contrast agent. For example, the duration of the individual phases of a contrast agent flow can vary depending on the body part to be examined or can be known beforehand, or can be determined by experiments or prior acquisitions.

K-space to be scanned is in particular three-dimensional.

The magnetic resonance apparatus according to the invention has a computer and/or control unit that is fashioned to implement the method described above.

BRIEF DESCRIPTION OF THE DRAWINGS

FIG. 3 is a schematic overview of method steps of an embodiment of the invention, FIG. 4 illustrates a division of k-space according to an exemplary embodiment of the invention FIG. 5 illustrates a division of k-space according to a further embodiment of the invention.

DESCRIPTION OF THE PREFERRED EMBODIMENTS

Figure 1:
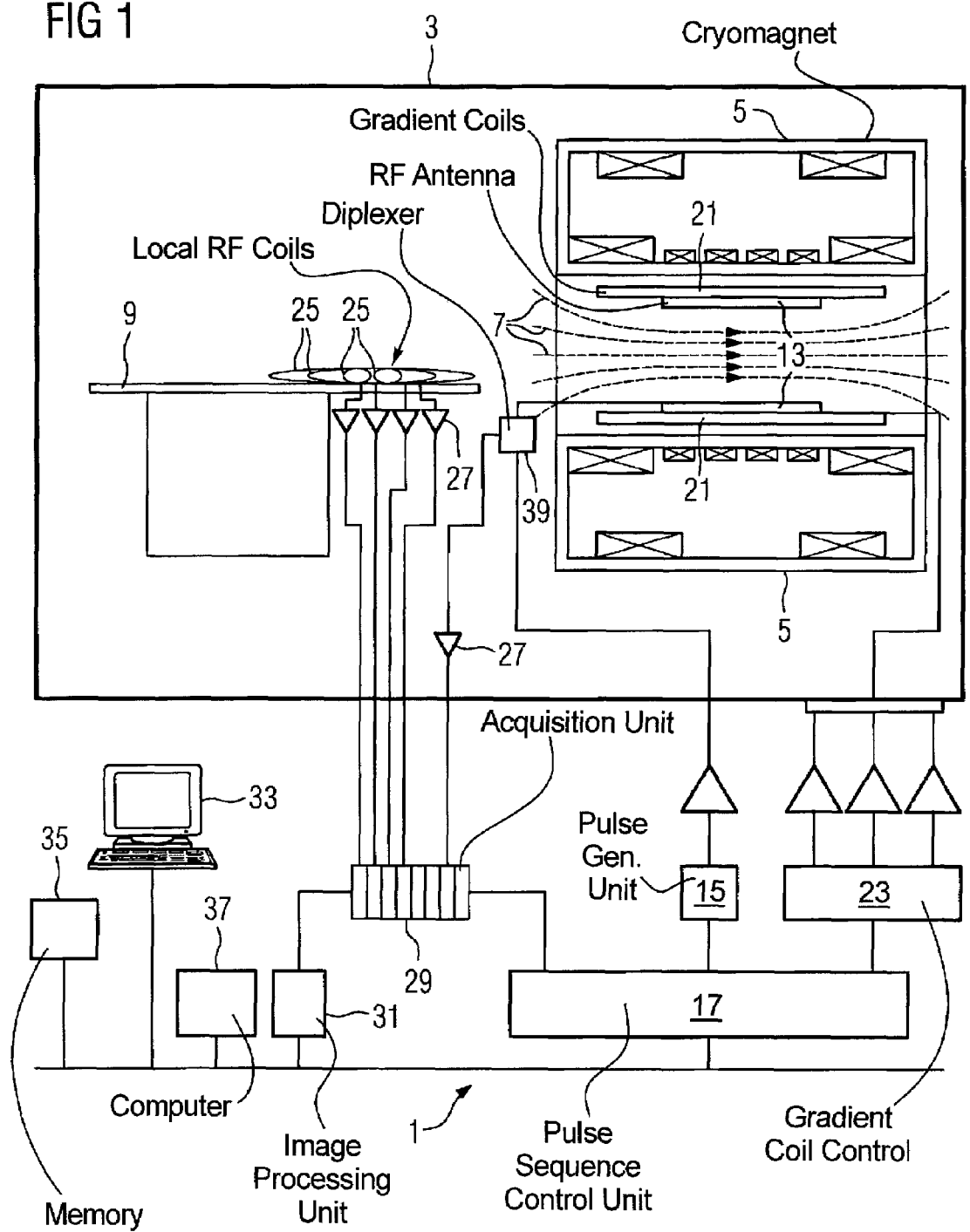
FIG. 1 is a schematic overview of a magnetic resonance apparatus.
Figure 2:
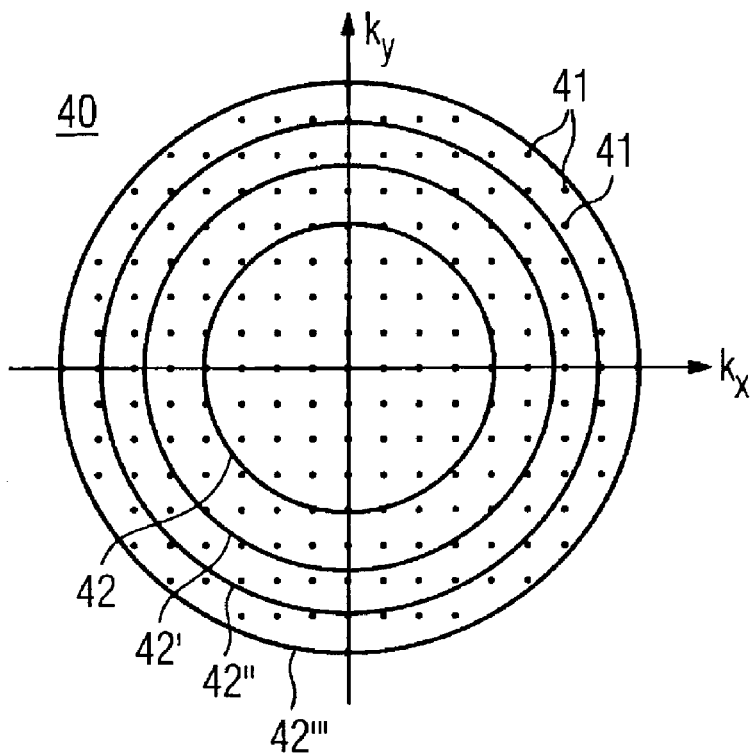
FIG. 2 illustrates a division of k-space according to a radial segmentation scheme as is known in the prior art.

FIG. 1 schematically shows the design of a magnetic resonance apparatus 1. The components of the magnetic resonance apparatus 1 with which the actual measurement is implemented are located in a radio-frequency-shielded measurement chamber 3. In order to examine a body by means of magnetic resonance imaging, various magnetic fields tuned as precisely as possible to one another in terms of their temporal and spatial characteristics are radiated at the body.

A strong magnet (typically a cryomagnet 5 with a tunnel-shaped opening) generates a static, strong basic magnetic field 7 that is typically 0.2 Tesla to 3 Tesla or more and that is largely homogeneous within a measurement volume. A body to be examined (not shown) is supported on a patient bed 9 and positioned in the basic magnetic field 7, more precisely in the measurement volume.

The excitation of the nuclear spins of the body ensues by magnetic radio-frequency excitation pulses that are radiated via a radio-frequency antenna (shown here as a body coil 13).

The radio-frequency excitation pulses are generated by a pulse generation unit 15 that is controlled by a pulse sequence control unit 17. After amplification by a radio-frequency amplifier 19, they are conducted to the radio-frequency antenna. The radio-frequency system shown here is merely schematically indicated. Typically, more than one pulse generation unit 15, more than one radio-frequency antenna 19 and multiple radio-frequency antennas are used in a magnetic resonance apparatus 1.

Furthermore, the magnetic resonance apparatus 1 has gradient coils 21 with which gradient fields for selective slice excitation and for spatial coding of the measurement signal are radiated in a measurement. The gradient coils 21 are controlled by a gradient coil control unit 23 that, like the pulse generation unit 15, is connected with the pulse sequence control unit 17.

The signals emitted by the excited nuclear spins are acquired by the body coil 13 and/or by local coils 25, amplified by associated radio-frequency preamplifiers 27 and processed further and digitized by an acquisition unit 29. The acquisition coils can also have multiple coil elements with which nuclear magnetic resonance signals are simultaneously acquired.

Given a coil that can be operated both in transmission mode and in reception mode (such as, for example, the body coil 13), the correct signal relaying is regulated by an upstream transmission/reception diplexer 39.

An image processing unit 31 generates from the measurement data an image that is presented to a user via an operator console 33, or that is stored in a memory unit 35. A central computer 37 controls the individual system components. The components of described magnetic resonance apparatus 1 corresponds to the prior art, with the differences discussed below.

The computer 37 and/or the additional components (such as, for example, the pulse sequence control unit 17) are fashioned such that the method according to the invention can be implemented therewith. The method according to the invention thus can be implemented with the magnetic resonance apparatus 1.

FIG. 3 shows a schematic overview of method steps that are implemented before the actual acquisition of the k-space data. K-space to be scanned is divided and the scan scheme is determined.

A division of k-space into an inner region and an outer region (Step 51) occurs at the beginning. A division of the inner region into inner segments (Step 53) as well as a division of the outer region into outer segments (Step 55) subsequently occur. Examples for the division of k-space, for a division of the inner region and for a division of the outer region are subsequently explained in detail using FIG. 4 and FIG. 5. In a further step, k-space lines of the inner region are associated with groups (Step 57). The division occurs such that k-space lines from various inner segments are associated with each group. K-space lines of the outer region are associated with groups in a similar manner (Step 59). Here the division also occurs such that k-space lines from various outer segments are associated with each group. Step 57 and Step 59 are explained more precisely later using FIG. 4 and FIG. 5.

FIG. 3 likewise shows method steps that are implemented in the acquisition of the k-space data of the inner region (Block 60). During this acquisition, the k-space lines of the inner region (see Step 57) that are distributed into groups are scanned. In a first step, a group is selected whose k-space lines have not yet been scanned (Step 61). Before scanning the k-space lines associated with this group, a suppression module is executed so that signals of adipose tissue protons are suppressed in the following acquisition (Step 63). For example, an inversion pulse or a frequency-selective saturation pulse can be radiated in the execution of the suppression module. The first k-space line of this group is subsequently scanned (Step 65) after a defined time interval after the suppression module. All k-space lines in this group are successively scanned until the last k-space line of this group is scanned (Step 67). If additional groups are present in which k-space lines have not yet been scanned, the next group is selected and their k-space lines are scanned analogously (Step 69). The acquisition of the k-space data of the inner region ensues during a time interval during which a specific condition is present in the subject to be examined, for example a specific phase of a contrast agent uptake.

FIG. 3 likewise shows method steps that are implemented in the acquisition of the k-space data of the outer region (Block 70). This acquisition subsequently ensues at the acquisition of the k-space data of the inner region (Block 60). During this acquisition, the k-space lines of the outer region (see Step 59) distributed into groups are scanned. In a first step, a group is selected whose k-space lines have not yet been scanned (Step 71). Before scanning the k-space lines associated with this group, a suppression module is executed such that signals of adipose tissue protons are suppressed (Step 73) in the following acquisition. For example, in the execution of the suppression module an inversion pulse or a frequency-selective saturation pulse can also be radiated here. The first k-space line of this group is subsequently scanned (Step 75) after a defined time interval after the suppression module. All k-space lines of this group are successively scanned until the last k-space line of this group is scanned (Step 77). If additional groups are present in which k-space lines have not yet been scanned, the next group is selected and its k-space lines are scanned analogously (Step 79). After ending the acquisition of the k-space data of the outer region (Block 70), a reconstruction of an image from the entirety of acquired k-space data can ensue (Step 81), possibly after further processing of the acquired k-space data. A reconstruction of the image can, for example, ensue via a multi-dimensional Fourier transformation. A reconstructed image can, for example, be displayed to a user or be stored in a database.

FIG. 4 shows a division of k-space 90 according to an exemplary embodiment of the invention.

K-space 90 to be scanned is three-dimensional k-space 90. Shown is a plane of k-space 90; the k-space lines 91 to be scanned run perpendicular to the plane and are indicated by points. The spacing of individual k-space lines 91 is not shown to scale, for clarity.

K-space 91 to be scanned is divided into an inner region 93 and an outer 95. The inner region 93 is for its part divided into inner segments 94, 94', 94", 94''' that differ in their distance from the k-space center 92. For clarity, the inner region 93 is shown again next to k-space 90. The inner region 93 here is divided according to a radial segmentation scheme. The size of the individual inner segments 94, 94', 94", 94''' is selected such that each inner segment 94, 94', 94", 94''' contains an identical number of k-space lines 91. The inner region 93 is thereby dimensioned such that all k-space lines of the inner region 93 can be acquired during one phase of the contrast agent uptake, for example during the arterial phase 98. This fact is symbolized by the small schematic diagrams 97 in FIG. 4. The arterial phase of a contrast agent flow begins at the point in time t1 after a contrast agent injection and lasts until the point in time t2. An equilibrium phase 99 of the contrast agent flow subsequently begins in which the contrast agent is present both in the arterial branch and in the venous branch of a vascular system. This phase lasts until the point in time t3.

How long such phases last depends on various factors such as, for example, the dynamic of the blood flow in the area to be examined, the volume of the vascular system in the volume to be examined, etc.

The outer region 95 is divided into outer segments 96, 96', 96", 96''' that differ in their distance from the k-space center. The outer region 95 here is divided according to a radial segmentation scheme in a manner analogous to the inner region 93. The size of the individual outer segments 96, 96', 96", 96''' is selected such that each outer segment 96, 96', 96", 96''' comprises an identical number of k-space lines 91. The number of the outer segments 96, 96', 96", 96''' of the outer region 95 corresponds to the number of inner segments 94, 94', 94", 94''' of the inner region 93. The k-space lines 91 of the outer region 95 are scanned after the inner region 93, for example during a further phase of the contrast agent uptake, for example during the equilibrium phase 99.

In the scanning of the k-space lines 91 of the inner region 93, the k-space lines 91 of the inner region 93 are divided into groups so that each group from each of the inner segments 94, 94', 94", 94''' comprises precisely one k-space line 91. A scanning of the k-space lines 91 associated with this group ensues in each group such that a k-space line 91 of the innermost inner segment 94 is scanned first, then a k-space line 91 of the adjoining inner segment 94' etc. A k-space line 91 of the outermost inner segment 94''' is scanned last. The order of the scanning of the k-space lines 91 of the inner region 93 is symbolized by the curved arrows 101.

In the scanning of the k-space lines 91 of the outer region 95, the k-space lines 91 of the outer region 95 are likewise divided into groups so that each group from each of the outer segments 96, 96', 96", 96''' contains precisely one k-space line 91. Scanning of the k-space lines 91 associated with this group ensues in each group such that a k-space line 91 of the innermost outer segment 96 is scanned first, then a k-space line 91 of the adjoining outer segment 96' etc. A k-space line 91 of the outermost outer segment 96''' is scanned last. The order of the scanning of the k-space lines 91 of the outer region 95 is symbolized by the curved arrows 102.

FIG. 5 shows a division of k-space according to a further exemplary embodiment of the invention.

The scanning of the inner k-space region ensues analogous to FIG. 4.

As in FIG. 4, in a scanning of the k-space lines 91 of the outer region 95, the k-space lines 91 are likewise divided into groups so that each group from each of the outer segments 96, 96', 96", 96''' comprises precisely one k-space line 91. However, within a group a scanning of the k-space lines 91 associated with this group ensues in precisely the opposite order as shown in FIG. 3. This means that a k-space line 91 of the outermost outer segment 96''' is scanned first, then a k-space line 91 of the adjoining outer segment 96" etc. A k-space line 91 of the innermost outer segment 96 is scanned last. The order of the scanning of the k-space lines 91 of the outer region 95 is symbolized here by the curved arrows 102.

With this scanning scheme, a scanning of the k-space lines 91 of the outermost inner segment 94''' consequently always occurs at the last position within a group. Scanning of the k-space lines 91 of the innermost outer segment 96 likewise always ensues at the last position within a group.

Possible jumps in contrast response within k-space 90 thus can be avoided, even in the transition region from the inner region 93 to the outer region 95, in particular when a contrast response that is reflected in the k-space lines 91 is altered due to the position of the k-space line 91 within a group.

For example, if a pulse for fat suppression is radiated before scanning of the k-space lines 91 of any one group, the degree of fat suppression in the scanning of a k-space line 91 depends on the position of this k-space line within a group. Because k-space lines 91 of the outermost inner segment 94''' are now scanned at the last position within a group (k-space trajectory like the k-space lines 91 of the innermost outer segment 96), these k-space lines exhibit the same degree of fat suppression. Possible jumps in the amplitude of the fat signal in k-space can be avoided in this manner.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance measurement data from a subject, comprising the steps of:
   providing an electronic repository for said measurement data, designated as k-space, and electronically dividing k-space into an inner region and an outer region;
   electronically dividing said inner region into a plurality of inner segments that respectively differ from each other in terms of respective distances from the center of k-space;
   electronically dividing said outer region into a plurality of outer segments that respectively differ from each other in terms of distance from the center of k-space;
   electronically entering first k-space data into said inner region in k-space lines of said inner region, and dividing said k-space lines of said inner region into first groups with k-space lines from different ones of said inner segments being associated in each of said first groups, and successively entering said first k-space data into said first groups; and
   electronically entering second k-space data into said outer region in k-space lines of said outer region, and dividing said k-space lines of said outer region into second groups with k-space lines from different ones of said outer segments being associated in each of said second groups, and successively entering said second k-space data into said second groups.

2. A method as claimed in claim 1 comprising, in at least a first part of each of said first groups, implementing a suppression module that suppresses signals of nuclear spins of a specific type before entering said first k-space data into k-space.

3. A method as claimed in claim 2 wherein said suppression module is configured to suppress nuclear spins of fatty tissue protons.

4. A method as claimed in claim 1 comprising, in at least a second part of each of said second groups, implementing a suppression module that suppresses signals of nuclear spins of a specific type before entering said second k-space data into k-space.

5. A method as claimed in claim 4 wherein said suppression module is configured to suppress nuclear spins of fatty tissue protons.

6. A method as claimed in claim 1 comprising respectively associating a k-space line from each of said inner segments with each of said first groups.

7. A method as claimed in claim 1 comprising respectively associating a k-space line from each of said inner segments with each of said second groups.

8. A method as claimed in claim 1 comprising dividing said inner region into a plurality of inner segments equal in number to a number of said outer segments into which said outer region is divided.

9. A method as claimed in claim 1 associating a number of k-space lines with each of said first groups that is equal to a number of k-space lines associated with each of said second groups.

10. A method as claimed in claim 1 comprising selecting a size of the respective inner segments to cause each of said inner segments to have an identical number of k-space lines.

11. A method as claimed in claim 1 comprising selecting a size of the respective outer segments to cause each of said outer segments to have an identical number of k-space lines.

12. A method as claimed in claim 1 comprising entering said first k-space data into said inner region by establishing an order for entering data into respective k-space lines in each group based on a distance of the respective k-space lines from the center of k-space, to cause k-space lines with a smaller distance from the center of k-space to have data entered therein before k-space lines with a greater distance from the center of k-space.

13. A method as claimed in claim 1 comprising entering said second k-space data into said outer region by establishing an order for entering data into respective k-space lines in each group based on a distance of the respective k-space lines from the center of k-space, to cause k-space lines with a smaller distance from the center of k-space to have data entered therein before k-space lines with a greater distance from the center of k-space.

14. A method as claimed in claim 1 comprising dimensioning a size of said inner region to allow said data to be entered into said inner region within a predetermined time interval.

15. A method as claimed in claim 1 comprising acquiring said magnetic resonance measurement data after injection of a contrast agent having a contrast agent flow associated therewith, and selecting said predetermined time interval dependent on said contrast agent flow.

16. A method as claimed in claim 1 comprising configuring said electronic repository as three-dimensional k-space.

17. A magnetic resonance apparatus comprising:
    a magnetic resonance data acquisition unit configured to interact with an examination subject to acquire magnetic resonance measurement data therefrom;
    an electronic data repository for said measurement data, designated as k-space; and
    a computer configured to enter said measurement data into said electronic data repository, designated as k-space, and to electronically divide k-space into an inner region and an outer region, and to electronically divide said inner region into a plurality of inner segments that respectively differ from each other in terms of respective distances from the center of k-space, and to electronically divide said outer region into a plurality of outer segments that respectively differ from each other in terms of distance from the center of k-space, and to electronically enter first k-space data into said inner region in k-space lines of said inner region, and to divide said k-space lines of said inner region into first groups with k-space lines from different ones of said inner segments being associated in each of said first groups, and to successively enter said first k-space data into said first groups, and to electronically enter second k-space data into said outer region in k-space lines of said outer region, and to divide said k-space lines of said outer region into second groups with k-space lines from different ones of said outer segments being associated in each of said second groups, and to successively enter said second k-space data into said second groups.

* * * * *